United States Patent
Felton et al.

[11] Patent Number: 6,066,977
[45] Date of Patent: May 23, 2000

[54] PROGRAMMABLE OUTPUT VOLTAGE LEVELS

[75] Inventors: Bradley Felton, Milpitas; Albert Chan, Palo Alto; Ju Shen, Saratoga; Cyrus Y. Tsui, Los Altos Hills; Rafael C. Camarota, Sunnyvale, all of Calif.

[73] Assignee: Lattice Semiconductor Corporation, Del.

[21] Appl. No.: 09/083,336

[22] Filed: May 21, 1998

[51] Int. Cl.[7] .................................................. H03K 17/16
[52] U.S. Cl. ............................................ 327/390; 327/589
[58] Field of Search ..................................... 327/536, 537, 327/589, 390, 540; 363/59, 60

[56] References Cited

U.S. PATENT DOCUMENTS

| | | | |
|---|---|---|---|
| 5,241,502 | 8/1993 | Lee et al. | 327/390 |
| 5,268,600 | 12/1993 | Yeu | 327/589 |
| 5,467,054 | 11/1995 | Ikeda | 327/589 |
| 5,594,380 | 1/1997 | Nam | 327/390 |
| 5,621,348 | 4/1997 | Furutani et al. | 327/589 |

*Primary Examiner*—Jung Ho Kim
*Attorney, Agent, or Firm*—Skjerven, Morrill et al.; Philip W. Woo, Esq.

[57] ABSTRACT

A circuit for providing programmable voltage output levels in a logic device includes a pull-up device for driving an output pad with either a first voltage output level or a second voltage output level. A charge pump generates a pumped voltage. A first clamp regulator, coupled to the charge pump and the pull-up device, receives a first reference signal. The first clamp regulator, in response to the first reference signal, generates a first voltage from which the first voltage output level is derived. A second clamp regulator, coupled to the pull-up device, receives a second reference signal. In response to the second reference signal, the second clamp regulator generates a second voltage from which the second voltage output level is derived. A passgate multiplexer is coupled to the first and second clamp regulators. The passgate multiplexer receives at least one output voltage select signal. In response to the at least one output voltage select signal the passgate multiplexer selects either the first voltage output level or the second voltage output level.

32 Claims, 1 Drawing Sheet

PROGRAMMABLE OUTPUT VOLTAGE LEVELS

TECHNICAL FIELD OF THE INVENTION

The present invention relates generally to semiconductor integrated circuits, and more particularly, to programmable output voltage levels.

BACKGROUND OF THE INVENTION

Many integrated circuit (IC) devices output and receive information in digital form—i.e., bits of data representing logical "1"s and logical "0"s. For output information, the voltage level for a logical "0" is generally referred to as "voltage output low" or "VOL," while the voltage level for a logical "1" is generally referred to as "voltage output high" or "VOH." For input information, the voltage level for a logical "0" is generally referred to as "voltage input low" or "VIL," while the voltage level for a logical "1" is generally referred to as "voltage input high" or "VIH."

Traditionally, the voltage level of VOH for most IC devices fell within a pre-defined range, thus ensuring that the data output of one IC device could be correctly interpreted by another IC device. Due to power considerations, however, many IC devices are now being implemented so that the maximum voltage level of VIH is lower than the maximum VOH value of the traditional, pre-defined range.

As a practical matter, this means that a system which incorporates a number of different IC devices may not function properly unless the differences in respective voltage levels for VOH have been resolved.

SUMMARY

The disadvantages and problems discussed above have been substantially reduced or eliminated using the present invention.

In accordance with one embodiment of the present invention, a circuit for providing programmable voltage output levels in a logic device includes a pull-up device for driving an output pad with either a first voltage output level or a second voltage output level. A charge pump generates a pumped voltage. A first clamp regulator, coupled to the charge pump and the pull-up device, receives a first reference signal. The first clamp regulator, in response to the first reference signal, generates a first voltage from which the first voltage output level is derived. A second clamp regulator, coupled to the pull-up device, receives a second reference signal. In response to the second reference signal, the second clamp regulator generates a second voltage from which the second voltage output level is derived. A passgate multiplexer is coupled to the first and second clamp regulators. The passgate multiplexer receives at least one output voltage select signal. In response to the at least one output voltage select signal the passgate multiplexer selects either the first voltage output level or the second voltage output level.

In accordance with another embodiment of the present invention, a circuit for providing programmable voltage output levels in a logic device includes a pull-up device for driving an output pad with either a first voltage output level or a second voltage output level. A precharge device is coupled to a capacitor and can charge the capacitor. A switch is coupled to the capacitor and the pull-up device. The switch cooperates with the capacitor and the precharge device to drive a gate of the pull-up device using a first voltage or a second voltage so that the pull-up device drives the output pad with the first voltage output level or the second voltage output level, respectively.

An important technical advantage of the present invention includes providing the capability for a user to selectively limit the voltage range for VOH in a logic device, thereby allowing the logic device to be combined with numerous other IC devices. A standard for minimum VOH under prescribed load conditions is also achieved by the invention. To accomplish this, a driver circuit prevents the voltage level for VOH in a logic device from exceeding a predetermined value as specified by an internally or externally generated reference voltage. The reference voltage can be selected so that the predetermined value for the VOH voltage level is less than the VCC of an IC device which receives the output of the logic device. Accordingly, the output of the logic device will not damage the IC device. Another technical advantage of the invention includes providing an NMOS-only driver circuit which can drive a logic "1" output level to a voltage value of VCC with a nominal load. Yet another technical advantage of the invention includes providing the ability to continuously adjust the voltage output range to meet the changing needs of a system environment. Other important technical advantages are readily apparent to one skilled in the art from the following figures, descriptions, and claims.

BRIEF DESCRIPTION OF THE DRAWINGS

For a more complete understanding of the present invention and for further features and advantages, reference is now made to the following description taken in conjunction with the accompanying drawings, in which.

DETAILED DESCRIPTION OF THE PREFERRED EMBODIMENTS

Figure 1:
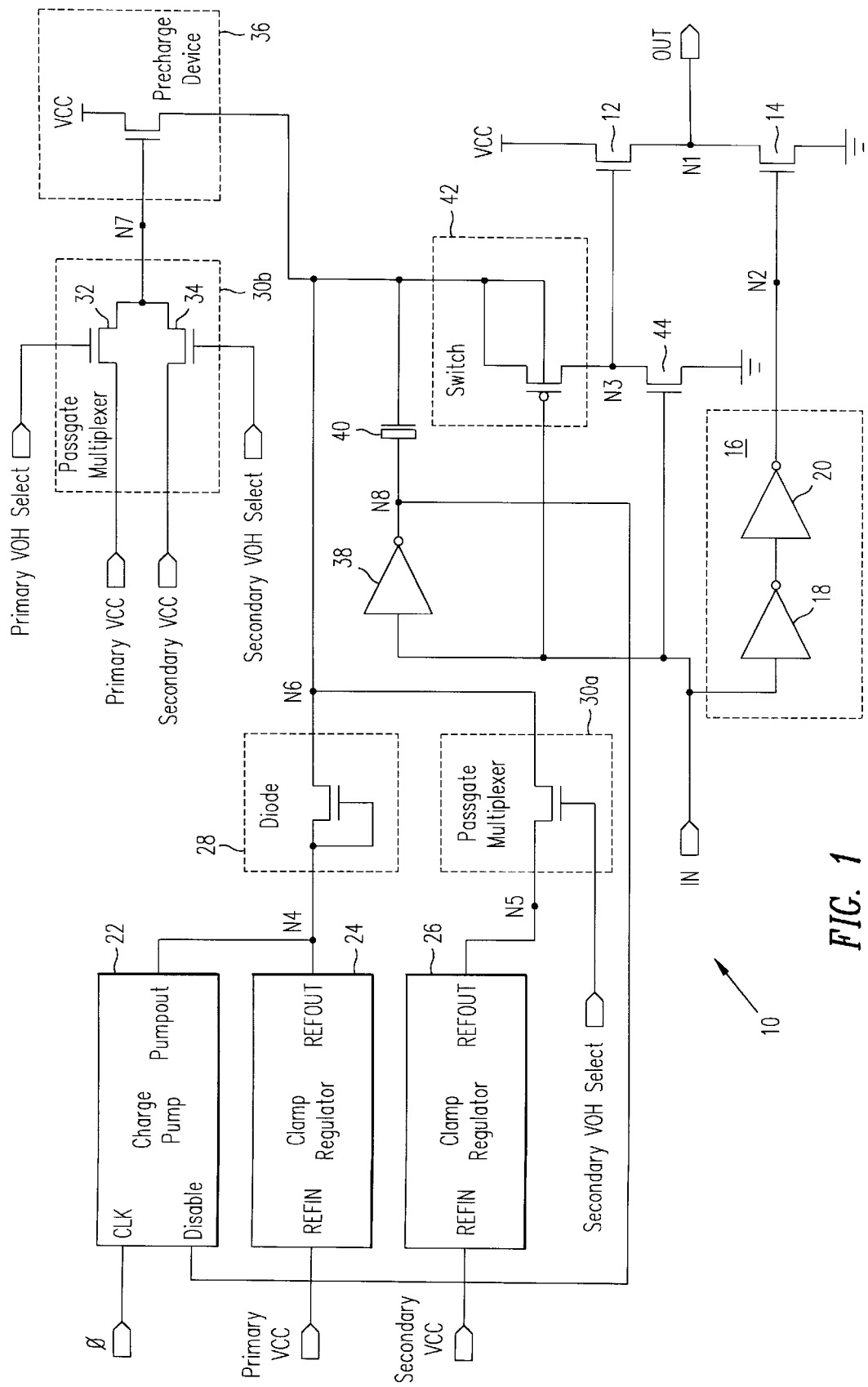
FIG. 1 is a schematic diagram of an exemplary embodiment of a driver circuit for providing programmable output voltage levels in a logic device, in accordance with the present invention.

The preferred embodiment of the present invention and its advantages are best understood by referring to FIG. 1 of the drawings.

FIG. 1 is a schematic diagram of an exemplary embodiment of a driver circuit 10 for providing programmable output voltage levels, in accordance with the present invention. Driver circuit 10 may be incorporated into a logic device, such as a programmable logic device (PLD), a complex programmable logic device (CPLD), a field programmable gate array, or any other suitable logic device. In general, driver circuit 10 functions to drive an output pad (not shown) of the logic device.

Driver circuit 10 includes a pull-up device 12 and a pull-down device 14 for driving the output pad. As shown, each of pull-up device 12 and pull-down device 14 comprises an n-type transistor so that the output pad driver structure is implemented solely in NMOS. These transistors can be relatively large devices in order to drive the output pad. The drain of pull-up device 12 is connected to VCC. As used herein, the terms "connected," "coupled," or any variant thereof, means any connection or coupling, either direct or indirect, between two or more elements. The source of pull-up device 12 is connected to the drain of pull-down device 14 at a node N1. The output (OUT) signal of driver circuit 10 is taken at node NI. The source of pull-down device 14 is connected to VSS or ground.

Pull-up device 12 functions as a source follower. As such, the voltage at the source of pull-up device 12 will be lower than the voltage at its gate by one MOS transistor threshold voltage (Vt). This relationship is true for gate voltages in the range of Vt to VCC+Vt, which would result in an OUT signal in the range of 0V to VCC. Because the drain of pull-up device 12 is connected to VCC, the voltage at its source cannot be higher than VCC even when its gate voltage is higher than VCC+Vt. Furthermore, because a source follower requires an impedance VSS or load, the voltage at the source of pull-up device 12 cannot drop below VSS or 0V.

A pull-down driver 16, comprising a first inverter gate 18 and a second inverter gate 20, are sequentially connected to the gate of pull-down device 14 at a node N2. Inverter gate 18 receives the input (IN) signal of driver circuit 10.

Inverter gates 18 and 20 amplify the IN signal sufficiently to drive the large pull-down device 14. When the value of the IN signal is a logical "1", pull-down driver 16 turns on pull-down device 14, and the voltage at node N1 is driven to 0V so that the value of the OUT signal is a logical "0". When the IN signal is a logical "0", pull-down device 14 is not turned on, and the voltage at node N1 is controlled by pull-up device 12.

Various circuitry is connected to the gate of pull-up device 12 at a node N3.

The voltage at node N3 determines the voltage level of the OUT signal. Accordingly, as described herein, the various circuitry allows the selection of a voltage level for V$_{OH}$ without changing the VCC applied to pull-up device 12.

The circuitry driving node N3 includes a charge pump 22 which, as shown, has a clock (CLK) and disable inputs and a pumpout output. At the CLK input, charge pump 22 may receive a clock signal $\phi$. Charge pump 22 generally functions to generate and sustain a pumped voltage which may have a relatively high voltage level. The pumped voltage is output by charge pump 22 at a node N4.

A first clamp regulator 24 is coupled to charge pump 22 at node N4.

Clamp regulator 24 has a reference-in (REFIN) input and a reference-out (REFOUT) output. Clamp regulator 24 receives a primary VCC signal at its REFIN input. This primary VCC signal can be the same as VCC for driver circuit 10. Clamp regulator 24 generally functions to clamp the voltage output of charge pump 22, thereby preventing the gate voltage at pull-up device 12 from becoming too high. This regulation also makes the output high-to-low transition of driver circuit 10 faster and more predictable. In one embodiment, the regulated, pumped voltage can be 3Vt above VCC.

A second clamp regulator 26 also has a reference-in (REFIN) input and a reference-out (REFOUT) output. Clamp regulator 26 receives a secondary VCC signal at its REFIN input. The secondary VCC signal is a reference voltage, which can be generated internally or externally. If externally generated, the secondary VCC signal may be supported by its own pin (not shown). With an externally generated secondary VCC signal, a user is able to set the maximum V$_{OH}$ to a desired voltage level, such as, for example, any voltage between 1.8V and 3.3V. As such, the secondary VCC signal can have any suitable voltage value for producing the desired secondary voltage output level limit. Stated differently, second clamp regulator 26 allows the output to switch between 0 and 3.3V, or any other desirable secondary voltage output level. To accomplish this, clamp regulator 26 may include a 1Vt clamp which is designed such that the current density in the 1Vt clamp is equal to or greater than the current density in pull-up device 12. This allows the voltage level of the output to be controlled so that it equals the reference voltage. The output of clamp regulator 26 appears at a node N5.

From the above, and as further described herein, charge pump 22 and first clamp regulator 24 are associated with and support one output voltage level for V$_{OH}$, while second clamp regulator 26 is associated with and supports another output voltage level for V$_{OH}$.

A diode 28 is connected to charge pump 22 and clamp regulator 24 at node N4. Diode 28 comprises an n-type transistor with its gate and drain connected to node N4. The source of the transistor is connected to a node N6. The operation of diode 28 drops the output voltage of the charge pump 22/clamp regulator 24 combination so that the voltage at node N6 is one Vt less than the voltage at node N4.

A passgate multiplexer 30 comprises a first part 30*a* and a second part 30*b*. The first part 30*a* of the passgate multiplexer 30 is connected to second clamp regulator 26 at node N5. This first part 30*a* comprises an n-type transistor coupled between nodes N5 and N6. A secondary V$_{OH}$ select signal is applied to the gate of the transistor. The second part 30*b* of passgate multiplexer 30 comprises n-type transistors 32 and 34. The primary VCC and secondary VCC signals are applied to the drains of transistors 32 and 34, respectively. The sources of transistors 32 and 34 are coupled together at a node N7. The secondary V$_{OH}$ select signal is applied to the gate of transistor 34, while a primary V$_{OH}$ select signal is applied to the gate of transistor 32. Each of the primary and secondary V$_{OH}$ select signals can be an externally generated signal supported by a respective pin (not shown). In general, passgate multiplexer 30 allows a user to select, via the primary and secondary V$_{OH}$ select signals, the voltage level of V$_{OH}$ output by driver circuit 10.

A precharge device 36 is coupled to the second part 30*b* of passgate multiplexer 30. Precharge device 36 comprises an n-type transistor with its gate connected to second part 30*b* of passgate multiplexer 30 at node N7. The drain of the transistor is connected to VCC, and its source is connected to diode 28 and the first part 30*a* of the passgate multiplexer at node N6. Precharge device 36 proportionately controls the voltage across a capacitor 40 (described below) based on the output reference level selected by the primary and secondary V$_{OH}$ select signals.

An inverter gate 38 receives the IN signal and its output appears at a node N8. The output of inverter gate 38 is received by charge pump 22 at its disable input. A capacitor 40 is connected to inverter gate 38, and coupled between nodes N8 and N6. Capacitor 40 maintains the voltage difference between nodes N8 and N6.

A switch 42 is connected to capacitor 40 and precharge device 36. Switch 42 comprises a p-type transistor coupled between nodes N6 and N3. The IN signal for driver circuit 10 is applied to the gate of the p-type transistor. The p-type transistor may be formed in its own independent n-well. This n-well is also connected to node N6. When the p-type transistor is turned off, switch 42 allows the voltage at node N6 to be pre-charged while the voltage at node N3 is discharged to 0V. When the p-type transistor is turned on, switch 42 allows the voltage at node N3 to follow the voltage at node N6.

An n-type transistor 44 is connected to switch 42, and coupled between node N3 and ground. The IN signal of driver circuit 10 is applied to the gate of transistor 44.

At any given moment, the various circuitry driving node N3 can be in one of three states. These three states are related to the voltage appearing at node N3: in the first state, the voltage at node N3 is 0V; in the second state, the voltage at node N3 is greater than VCC+Vt; and in the third state, the voltage at node N3 is the voltage level of the secondary VCC signal (V(secondaryVCC)) plus Vt.

Four possible transitions can be made between the three states for the circuitry driving node N3. These transitions are determined or controlled by the IN signal, the primary V$_{OH}$ select signal, and the secondary V$_{OH}$ select signal. In a first transition, when the primary V$_{OH}$ select signal is high, the secondary V$_{OH}$ select signal is low, and the IN signal goes from a high value to a low value (i.e., switches from VCC to 0V), the voltage at node N3 will switch from 0V to >VCC+Vt. In a second transition, when the primary V$_{OH}$ select signal is high, the secondary V$_{OH}$ select signal is low, and the IN signal switches from 0V to VCC, the voltage at node N3 will switch from >VCC+Vt to 0V. In a third transition, when the secondary V$_{OH}$ select signal is high, the primary V$_{OH}$ select signal is low, and the IN signal switches from VCC to 0V, the voltage at node N3 will switch from 0V to V(secondaryVCC)+Vt. In a fourth transition, when the secondary V$_{OH}$ select signal is high, the primary V$_{OH}$ select signal is low, and the IN signal switches from 0V to VCC, the voltage at node N3 will switch from V(secondaryVCC)+Vt to 0V.

Although driver circuit 10 has been shown and described as implemented on a p-substrate with NMOS devices for the output pad drive structure (i.e., the pull-up and pull-down devices), it should be understood that, in an alternative embodiment, driver circuit 10 may be implemented on an n-substrate with PMOS devices for the output pad drive structure.

Driver circuit 10 may operate in two modes: (1) primary V$_{OH}$ mode, and (2) secondary V$_{OH}$ mode. The mode is selected by the primary and secondary V$_{OH}$ select signals. Specifically, a high value for the primary V$_{OH}$ select signal and a low value for the secondary V$_{OH}$ select signal will select the primary V$_{OH}$ mode. A high value for the secondary V$_{OH}$ select signal and a low value for the primary V$_{OH}$ select signal will select the secondary V$_{OH}$ mode. In the primary V$_{OH}$ mode, the voltage level of V$_{OH}$ for driver circuit 10 is VCC. In the secondary V$_{OH}$ mode, the voltage level of V$_{OH}$ for driver circuit 10 is the secondary voltage output level (e.g., any voltage between 1.8V and 3.3V). Accordingly, driver circuit 10 is "programmable" in the sense that a user can use the secondary VCC, primary V$_{OH}$ select, and secondary V$_{OH}$ select signals to configure the output voltage level.

For each of the primary and secondary V$_{OH}$ modes, when the IN signal goes from 0V to VCC, transistor 44 turns on, and node N3 is pulled to 0V. Inverter gate 38 drives the voltage at node N8 from VCC to 0V. Due to the capacitive coupling of capacitor 40, the voltage at node N6 is driven down by VCC. As such, the voltage at the source of the p-type transistor in switch 42 is approximately equal to Vt. With the voltage at the gate of the p-type transistor going from 0V to VCC and the voltage at its drain at 0V, the p-type transistor turns off, and consequently, does not impede the pulling of the voltage at node N3 to 0V or the voltage at node N6 to VCC. The transistor in precharge device 36 turns on whenever the voltage at node N6 is more then one Vt lower then the voltage at node N7. At such time, the voltage on node N6 will be the precharge voltage across capacitor 40. Thus, in the primary V$_{OH}$ mode, the voltage across capacitor 40 will be VCC−Vt, while in the secondary V$_{OH}$ mode, the voltage across capacitor 40 will be V(secondaryVCC)−Vt. From the above, it is clear that switch 42 allows the voltage at node N6 to be a precharge voltage, while allowing the voltage at node N3 to be 0V, thereby turning off pull-up device 12.

When the IN signal goes from VCC to 0V, transistor 44 turns off, thereby allowing the voltage at node N3 to be driven. Inverter gate 38 drives the voltage at node N8 from 0V to VCC. Due to the capacitive coupling of capacitor 40, the voltage at node N6 also changes. The p-type transistor in switch 42 turns on since the voltage at its gate goes to 0V and the voltage at its source rises. Once the p-type transistor is on, nodes N6 and N3 are connected, and the voltage at node N3 will follow the voltage at node N6 even if the N6 voltage is higher than VCC. At this point, driver circuit 10 works differently depending on which V$_{OH}$ mode has been selected.

In the primary V$_{OH}$ mode, the voltage at node N6 will initially rise to VCC+VCC−Vt, since the p-type transistor in switch 42 and the n-type transistor in diode 28 become reverse-biased diodes when the voltage at node N6 is higher than the voltage at node N4. As the p-type transistor turns on to connect nodes N6 and N3, the charge in capacitor 40 raises the voltage at node N3. Capacitor 40 can be implemented or sized such that a charged voltage of VCC+VCC−Vt on node N6 produces a voltage that is greater than VCC+Vt on the connected nodes N3 and N6. Charge pump 22 and first clamp regulator 24 will maintain and regulate this >VCC+Vt voltage at node N6. Diode 28 prevents the charge of capacitor 40 from going to clamp regulator 24 before such charge raises the voltage at node N3.

In the secondary V$_{OH}$ mode, the transistor in the first part 30a of passgate multiplexer 30 is turned on so that second clamp regulator 26 is applied directly to node N6. This prevents the voltage at node N6, and ultimately at node N3, from exceeding or overshooting the V(secondaryVCC)+Vt level. To facilitate the clamp regulator's function of preventing overshoot, the precharge voltage across capacitor 40 is less, in proportion to the secondary VCC.

Although driver circuit 10 has been described as having only two voltage output levels (i.e., those associated with the primary and secondary V$_{OH}$ modes), it should be understood that even more output voltage levels can be made available with minimal additional circuitry. This can be accomplished, for example, by duplicating elements 26, 30a, and 34 for each desired, additional output voltage level. Further, it should be understood that, in other embodiments, at least a portion of the various circuitry for driving pull-up device 12 at node N3 can be repeated to drive pull-down device 14 at node N2.

In the manner described above, driver circuit 10 provides a plurality of different voltage levels for V$_{OH}$ (i.e., the "high" voltage output) so that a user may select a voltage level that is appropriate for any circuit receiving the OUT signal of driver circuit 10. Accordingly, any logic device into which driver circuit 10 is incorporated will be compatible with numerous other integrated circuits (e.g., microprocessors, memory, application specific integrated circuits, etc.) which may operate at voltage levels different from the logic device. Furthermore, driver circuit 10 utilizes a single power supply VCC, and accordingly, does not require numerous power rings in order to provides multiple output voltage levels. In addition, driver circuit 10 allows a logic device to be more readily programmable by pin. Further, the reference pin (supporting an externally generated secondary VCC signal) can be used to continuously adjust the output range to meet the changing needs of a system environment.

Although the present invention and its advantages have been described in detail, it should be understood that various changes, substitutions, and alterations can be made therein without departing from the spirit and scope of the invention as defined by the appended claims.

What is claimed is:

1. A circuit for providing programmable voltage output levels in a logic device, the circuit comprising:
   a pull-up device for driving an output pad with either a first voltage output level or a second voltage output level;
   a charge pump generating a pumped voltage;
   a first clamp regulator coupled to the charge pump and the pull-up device, the first clamp regulator receiving a first reference signal, the first clamp regulator generating in response to the first reference signal a first voltage from which the first voltage output level is derived;
   a second clamp regulator coupled to the pull-up device, the second clamp regulator receiving a second reference signal, the second clamp regulator generating in response to the second reference signal a second voltage from which the second voltage output level is derived; and
   a passgate multiplexer coupled to each of the first clamp regulator, the second clamp regulator, and the pull-up device, the passgate multiplexer receiving at least one output voltage select signal, the passgate multiplexer causing the pull-up device to drive the output pad with either the first voltage output level or the second voltage output level in response to the at least one output voltage select signal.

2. The circuit of claim 1, wherein at least one of the first and second reference signals is internally generated.

3. The circuit of claim 1, wherein at least one of the first and second reference signals is externally generated.

4. The circuit of claim 1, wherein the at least one output voltage select signal comprises:
   a primary output voltage select signal for selecting the first voltage output level; and
   a secondary output voltage select signal for selecting the second voltage output level.

5. The circuit of claim 1, wherein the pull-up device is connected as a source follower.

6. The circuit of claim 1, further comprising:
   a capacitor;
   a precharge device coupled to the capacitor, the precharge device for charging the capacitor to a first precharge voltage level or a second precharge voltage level; and
   wherein the at least one output voltage select signal selects either the first precharge voltage level or the second precharge voltage level.

7. The circuit of claim 1, further comprising:
   a capacitor;
   a precharge device coupled to the capacitor, the precharge device for charging the capacitor; and
   a switch coupled to the capacitor and the pull-up device, the switch allowing the precharge device to charge the capacitor.

8. The circuit of claim 7, wherein the passgate multiplexer, the capacitor, the precharge device, and the switch cooperate to drive a gate of the pull-up device using the first voltage or the second voltage so that the pull-up device drives the output pad with the first voltage output level or the second voltage output level, respectively.

9. The circuit of claim 7, wherein the switch comprises a p-type transistor.

10. The circuit of claim 9, further comprising an n-type transistor coupled between the switch and ground, the n-type transistor for pulling a voltage at the gate of the pull-up device to ground.

11. The circuit of claim 1, further comprising a pull-down device for pulling the output pad to ground.

12. The circuit of claim 11, further comprising a pull-down driver to drive the pull-down device.

13. A circuit for providing programmable voltage output levels in a logic device, the circuit comprising:
   a pull-up device for driving an output pad with either a first voltage output level or a second voltage output level;
   a pull-down device for pulling the output pad to ground;
   a capacitor;
   a precharge device coupled to the capacitor, the precharge device for charging the capacitor; and
   a switch coupled to the capacitor and the pull-up device, the switch cooperating with the capacitor and the precharge device to drive a gate of the pull-up device using a first voltage or a second voltage so that the pull-up device drives the output pad with the first voltage output level or the second voltage output level, respectively.

14. The circuit of claim 13, further comprising:
   a charge pump generating a pumped voltage;
   a first clamp regulator coupled to the charge pump and the pull-up device, the first clamp regulator regulating the value of the pumped voltage to generate the first voltage from which the first voltage output level is derived; and
   a second clamp regulator coupled to the pull-up device, the second clamp regulator receiving a reference signal, the second clamp regulator generating in response to the reference signal [a] the second voltage from which the second voltage output level is derived.

15. The circuit of claim 14, wherein the reference signal is internally generated.

16. The circuit of claim 14, wherein the reference signal is externally generated.

17. The circuit of claim 14, further comprising a passgate multiplexer coupled to each of the first clamp regulator, the second clamp regulator, and the pull-up device, the passgate multiplexer receiving at least one output voltage select signal, the passgate multiplexer causing the pull-up device to drive the output pad with either the first voltage output level or the second voltage output level in response to the at least one output voltage select signal.

18. The circuit of claim 14, wherein the at least one output voltage select signal comprises:
   a primary output voltage select signal for selecting the first voltage output level; and
   a secondary output voltage select signal for selecting the second voltage output level.

19. The circuit of claim 13, wherein the pull-up device is connected as a source follower.

20. The circuit of claim 13, further comprising a pull-down driver to drive the pull-down device.

21. An output circuit, comprising:
   an output terminal;
   a first transistor having a drain terminal coupled to receive a power supply voltage, a source terminal coupled to said output terminal, and a gate terminal;
   a second transistor having a drain terminal coupled to said output terminal, a gate terminal, and a source terminal coupled to receive a ground reference voltage; and
   a dual-voltage generation circuit receiving a reference voltage lower than said power supply voltage and coupled to said gate terminal of said first transistor to selectably provide on said gate terminal of said first transistor either (a) a first voltage higher than said power supply voltage, or (b) a second voltage substantially equal to said reference voltage plus the threshold voltage of said first transistor.

22. An output circuit as in claim 21, wherein said first voltage is substantially twice said power supply voltage.

23. An output circuit as in claim 21, wherein said dual-voltage generation circuit comprises:

a capacitor having a first terminal and a second terminal, said first terminal coupled to said gate terminal of said first transistor; and a charging circuit receiving a control signal and coupled to said first and second terminals of said capacitor, said charging circuit providing said first and second voltages at said gate terminal of said first transistor according to the voltage of said control signal.

24. An output circuit as in claim 23, said charging circuit comprising:

a precharge circuit coupled to said first terminal of said capacitor, wherein when said dual-voltage generation circuit provides said first voltage, said precharge circuit charges said capacitor such that the voltage across said first and second terminal of said capacitor reaches a predetermined voltage; and an inverter coupled to said second terminal of said capacitor, wherein when said dual-voltage generation circuit provides said first voltage, said inverter circuit switches, after said capacitor reaches said predetermined voltage, such that said second terminal of said capacitor changes from substantially ground reference voltage to substantially said power supply voltage, such that said voltage at said gate terminal of said first transistor exceeds said power supply voltage.

25. An output circuit as in claim 21, further comprising a clamping circuit for maintaining said first voltage.

26. An output circuit as in claim 25, wherein said clamping circuit further comprises a charge pump circuit for, when enabled, maintaining said first voltage above said power supply voltage.

27. An integrated circuit, comprising:

a plurality of output terminals; and a plurality of output circuits each providing an output signal on a designated one of said output terminals, each output circuit receiving an input control signal, said output circuit comprising:

(a) a first transistor having a drain terminal coupled to receive a power supply voltage, a source terminal coupled to said designated output terminal, and a gate terminal;

(b) a second transistor having a drain terminal coupled to said output terminal, a gate terminal, and a source terminal coupled to receive a ground reference voltage; and (c) a dual-voltage generation circuit receiving a reference voltage lower than said power supply voltage and coupled to said gate terminal of said first transistor to provide said gate terminal of said first transistor, according to said input signal, either (a) a first voltage higher than said power supply voltage, or (b) a second voltage substantially equal to said reference voltage plus the threshold voltage of said first transistor.

28. An integrated circuit as in claim 27, wherein said first voltage is substantially twice said power supply voltage.

29. An integrated circuit as in claim 27, wherein said dual-voltage generation circuit of each output circuit comprises:

a capacitor having a first terminal and a second terminal, said first terminal coupled to said gate terminal of said first transistor; and a charging circuit receiving a control signal and coupled to said first and second terminals of said capacitor, said charging circuit providing said first and second voltages at said gate terminal of said first transistor according to the voltage of said control signal.

30. An integrated circuit as in claim 29, said charging circuit comprising:

a precharge circuit coupled to said first terminal of said capacitor, wherein when said dual-voltage generation circuit provides said first voltage, said precharge circuit charges said capacitor such that the voltage across said first and second terminal of said capacitor reaches a predetermined voltage; and an inverter coupled to said second terminal of said capacitor, wherein when said dual-voltage generation circuit provides said first voltage, said inverter circuit switches, after said capacitor reaches said predetermined voltage, such that said second terminal of said capacitor changes from substantially ground reference voltage to substantially said power supply voltage, such that said voltage at said gate terminal of said first transistor exceeds said power supply voltage.

31. An integrated circuit as in claim 27, further comprising a clamping circuit for maintaining said first voltage.

32. An integrated circuit as in claim 31, wherein said clamping circuit further comprises a charge pump circuit for, when enabled, maintaining said first voltage above said power supply voltage.

* * * * *